(12) United States Patent
Uy

(10) Patent No.: US 7,535,468 B2
(45) Date of Patent: May 19, 2009

(54) INTEGRATED SENSING DISPLAY

(75) Inventor: Michael Uy, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 644 days.

(21) Appl. No.: 10/873,575

(22) Filed: Jun. 21, 2004

(65) Prior Publication Data

US 2006/0007222 A1  Jan. 12, 2006

(51) Int. Cl.
 *G09G 5/00* (2006.01)
 *G06F 3/038* (2006.01)
 *G09G 3/34* (2006.01)
(52) U.S. Cl. .................. 345/207; 345/214; 345/104; 348/294
(58) Field of Classification Search ......... 345/104, 345/207, 107, 214; 348/14.07, 211.12, 333.1, 348/294
See application file for complete search history.

(56) References Cited

U.S. PATENT DOCUMENTS

| 5,340,978 | A  * | 8/1994 | Rostoker et al. ......... 250/208.1 |
| 7,034,866 | B1 * | 4/2006 | Colmenarez et al. ... 348/211.12 |
| 7,068,254 | B2 * | 6/2006 | Yamazaki et al. ........... 345/104 |
| 7,158,129 | B2 * | 1/2007 | Nakajima .................... 345/207 |

FOREIGN PATENT DOCUMENTS

| WO | WO-02/43386 A1 | 5/2002 |
| WO | WO-2004/107301 A1 | 12/2004 |

* cited by examiner

*Primary Examiner*—Kevin M Nguyen

(57) ABSTRACT

An integrated sensing display is disclosed. The sensing display includes display elements integrated with image sensing elements. As a result, the integrated sensing device can not only output images (e.g., as a display) but also input images (e.g., as a camera).

22 Claims, 7 Drawing Sheets

INTEGRATED SENSING DISPLAY

BACKGROUND OF THE INVENTION

1. Field of the Invention

The present invention relates to video input and output devices.

2. Description of the Related Art

Pixels are the fundamental unit upon which all displays function. Short for Picture Element, a pixel is a single point in a graphic image. Graphics monitors display pictures by dividing the display screen into thousands (or millions) of pixels, arranged in rows and columns. The pixels are so close together that they appear connected.

The quality of a display system largely depends on its resolution, how many pixels it can display, and how many bits are used to represent each pixel. VGA systems display 640 by 480, or 307,200 pixels. In contrast, SVGA systems display 800 by 600, or 480,000 pixels.

The number of bits used to represent each pixel determines how many colors or shades of gray can be displayed. For example, in 8-bit color mode, the color monitor uses 8 bits for each pixel, making it possible to display 2 to the 8th power (256) different colors or shades of gray. True Color systems use 24 bits per pixel, allowing them to display more than 16 million different colors.

Different types of display technologies use different methods to isolate pixels. For example, cathode ray tube (CRT) monitors work by aiming a beam of electrons at some phosphor, which in turn glows. This glow is perceived as a pixel on the screen. A standard color monitor has one red, one green and one blue dot at each location on the screen. A corresponding electron gun for each color emits an electron beam of varying intensity, which corresponds to color brightness.

To ensure that the electrons from each gun strike the corresponding phosphor, a shadow mask can be used. FIG. 1A depicts an exemplary conventional shadow mask 100. Because the three electron beams arrive at slightly different angles (from the three separate electron guns), it is possible to construct and align the shadow mask 100 such that the electron beam from one gun will strike the correct phosphor dot, but the other two phosphors will be in shadow. The intensity of red, green and blue can therefore be separately controlled at each dot triad location.

Some CRTs use an aperture grill instead of a shadow mask. FIG. 1B depicts an exemplary conventional aperture grill 150. The aperture grill 150 uses hundreds of fine metal strips that run vertically from the top of the screen surface to the bottom. These strips perform the same function as the shadow mask—they force the electron beam to illuminate only the correct parts of the screen.

Other systems, such as the Pioneer deep encased cell structure, available in plasma high-definition television (HDTV) displays from the Pioneer Corporation based in Tokyo, Japan, use three individual wells (one for each color element) for each pixel. FIG. 1C depicts an exemplary conventional deep encased cell structure 175. The deep encased cell structure 175 additionally includes black strips 180 run the length of the display to improve contrast. The black strips 180 are provided over deep black wells. The black strips 180 and the counterpart deep black wells can improve contrast in a display.

Displays can then be combined with digital cameras in order to facilitate two-way communication. Typically, a small digital camera is placed in close proximity to a display. FIG. 2 shows an exemplary conventional two-way communication set-up 200. A digital camera 210 is mounted on top of a computer monitor 205 in order to capture the facial expressions of the user. Digital images are generally captured with an integrated circuit having a charge-coupled devices (CCD) and/or complementary metal-oxide-semiconductor CMOS imagers. CCDs and CMOS imagers are specially made integrated circuits that respond to light. CCDs and CMOS imagers are used to capture image data in devices such as telescopes, bar code readers, digital still and video cameras, and scanners. A CCD is a collection of tiny light-sensitive diodes, which convert photons (light) into electrons (electrical charge). These diodes are called photosites. Each photosite is sensitive to light—the brighter the light that hits a single photosite, the greater the electrical charge that will accumulate at that site.

Although the described technologies work well in many applications, there are continuing efforts to further improve user experience.

SUMMARY OF THE INVENTION

The invention pertains to an integrated sensing display. The integrated sensing display includes both display elements and image sensing elements. As a result, the integrated sensing device can not only output images (e.g., as a display) but also input images (e.g., as a camera).

According to one embodiment, a device includes at least: a display area; an array of display elements located within the display area, each display element capable of displaying a pixel of information, either alone or in combination with other display elements; and an array of image elements located within the display area, each image element being capable of capturing visual information from a source in front of the display area. The device can further include provide each image element with a lens that does not interfere with any display elements. Optionally, the image elements can be located within a housing which provides isolation.

According to another embodiment, a device includes at least: an illumination area that includes at least one light source that emits light; and an array of image elements dispersed throughout the illumination area. Each image element being capable of capturing visual information from a source in front of the illumination area. The image elements are dispersed such that space in-between at least some image elements is able to emit light from the at least one light source of the illumination area.

Other objects, features, and advantages of the present invention will become apparent upon examining the following detailed description of an embodiment thereof, taken in conjunction with the attached drawings.

BRIEF DESCRIPTION OF THE DRAWINGS

The invention may best be understood by reference to the following description taken in conjunction with the accompanying drawings in which.

It is to be understood that, in the drawings, like reference numerals designate like structural elements. Also, it is understood that the depictions in the figures are not necessarily to scale.

DETAILED DESCRIPTION OF THE PREFERRED EMBODIMENTS

In the following description, numerous specific details are set forth to provide a thorough understanding of the present invention. However, it will be obvious to one skilled in the art that the present invention may be practiced without some or all of these specific details. In other instances, well known processes have not been described in detail in order to avoid unnecessarily obscuring the present invention.

The invention pertains to an integrated sensing display. The integrated sensing display includes both display elements and image sensing elements (image elements). As a result, the integrated sensing device can not only output images (e.g., as a display) but also input images (e.g., as a camera).

The present invention involves a series of image elements, each one corresponding to a single pixel, that are regularly distributed in housings in a two-dimensional array among display pixels of a display device. The display device can, for example, be a liquid crystal display (LCD) panel. Each of the image elements has both a sensor and a lens. The lens is specific to the individual sensor, and created at fabrication.

A panel created from an integrated, embedded macro CCD would thus be able to both display and record visual information simultaneously, without the use of an external video capture device. Simply put, the same panel could display a video conference while also recording the participant sitting in front of it.

A video panel that has an embedded macro CCD is no longer just a display. It can be used to transmit as well as receive visual information. One use and benefit for such a panel is video conferencing: a user can maintain eye contact with someone on screen because the camera is "in" the screen. In addition, portable devices, such as portable digital assistants (PDAs) and cell phones, have very limited space for displays and would benefit if additional real estate were not used for a camera.

Furthermore, the concept could be used in non-display devices as well. If at least one pixel were merely a light source, the camera would be capable of performing in dark spaces with little space, such as with a medical probe. Here, the surrounding display pixels could be used to transmit light, while the integrated sensing pixels recorded the image.

Figure 1A:
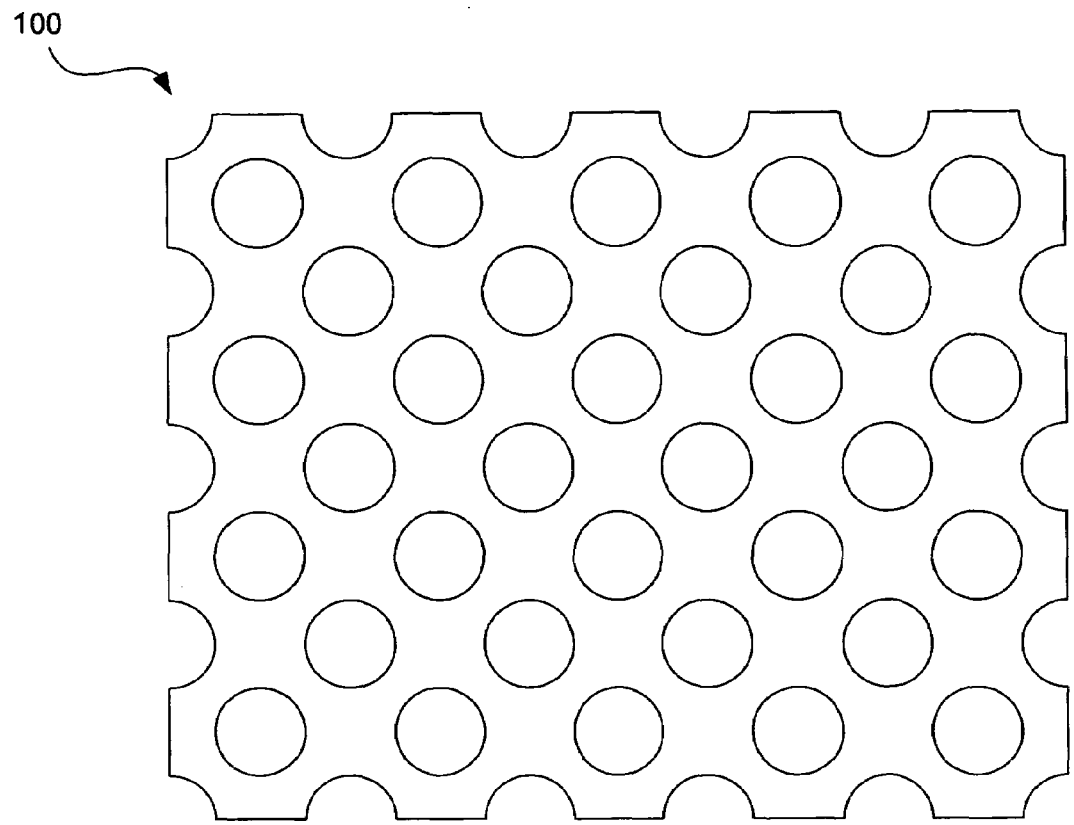
FIG. 1A depicts an exemplary conventional shadow mask.
Figure 1B:
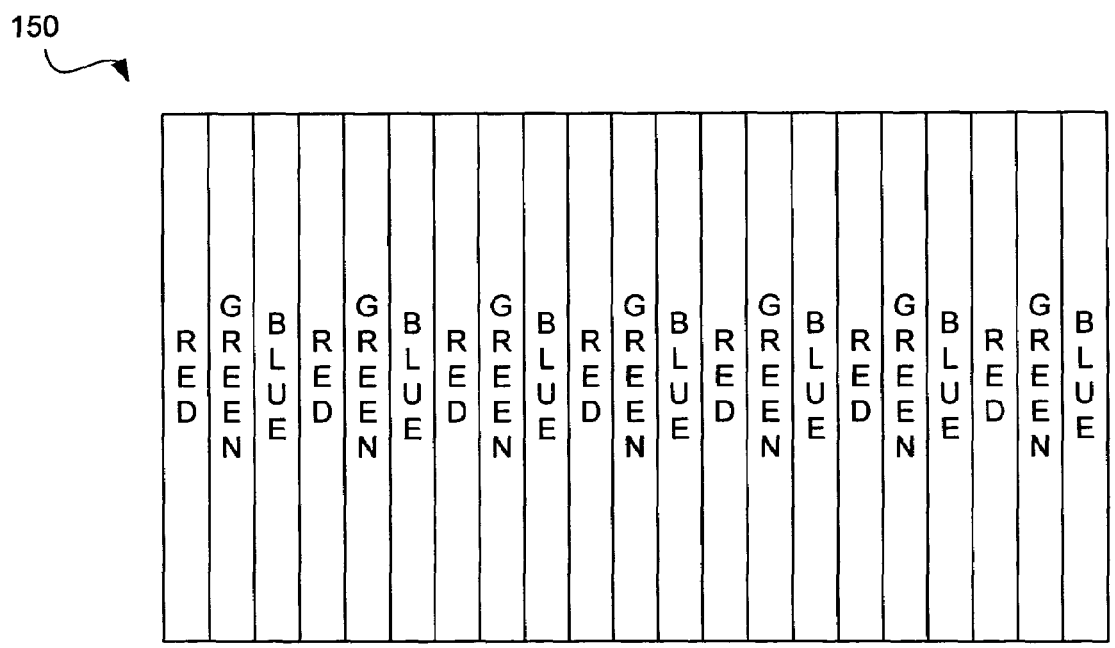
FIG. 1B depicts an exemplary conventional aperture grill.
Figure 1C:
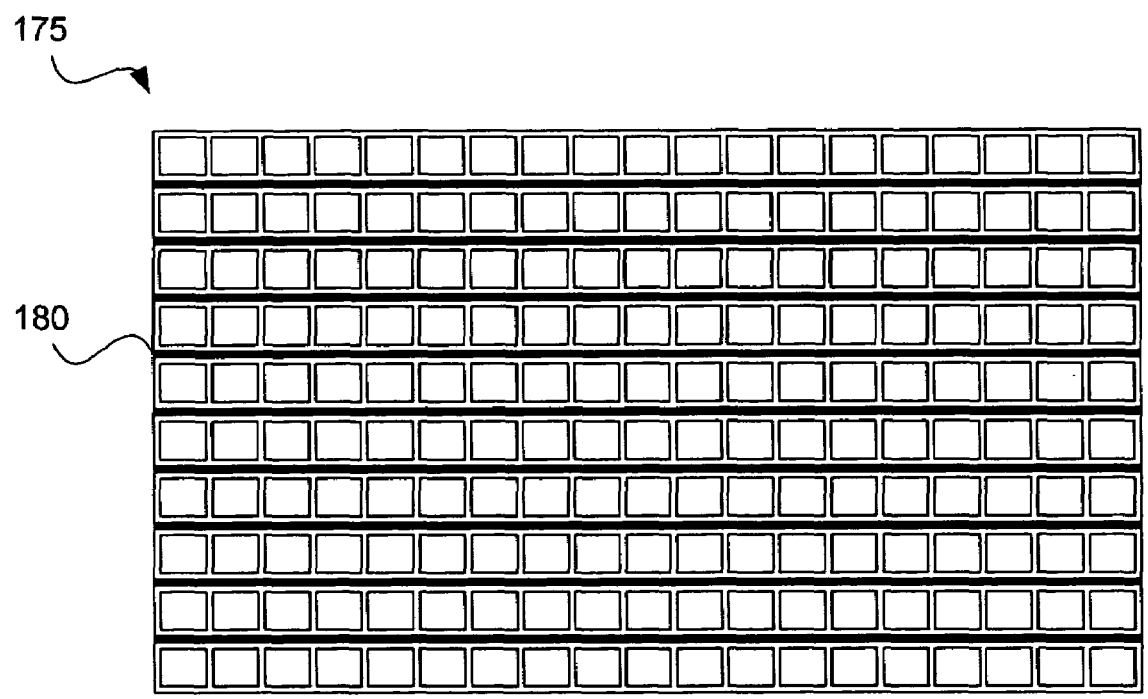
FIG. 1C depicts an exemplary conventional deep encased cell structure.
Figure 2:
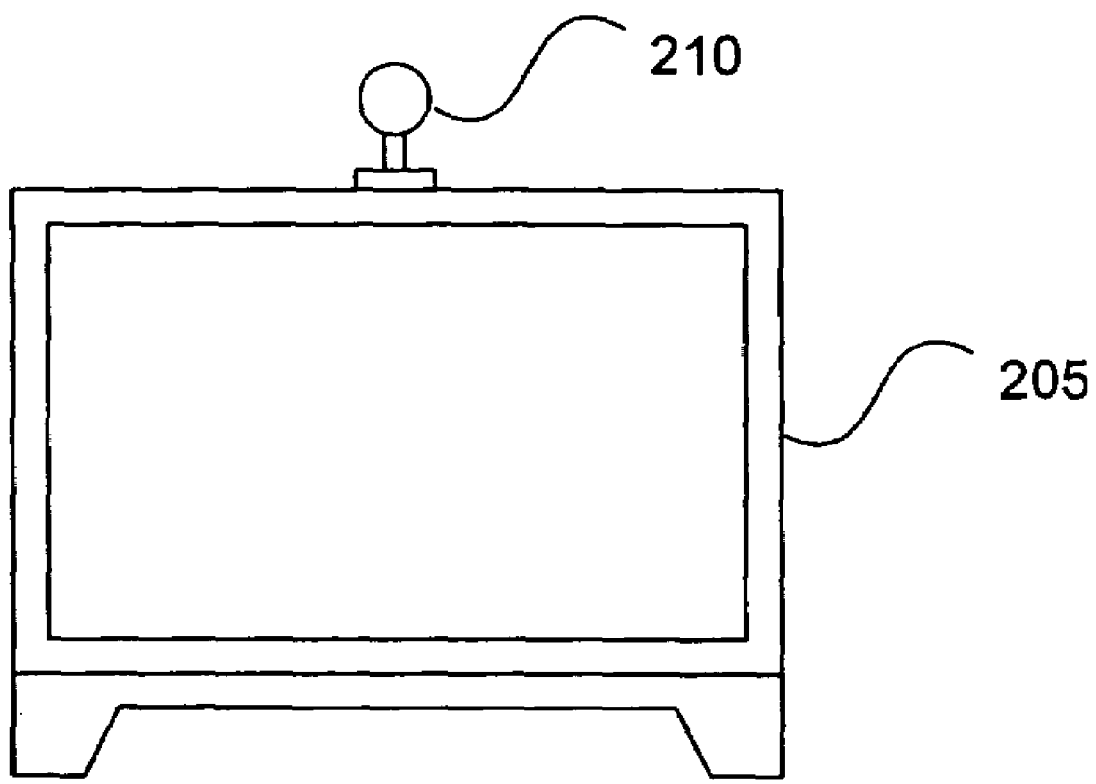
FIG. 2 shows an exemplary conventional art two-way communication set-up.
Figure 3A:
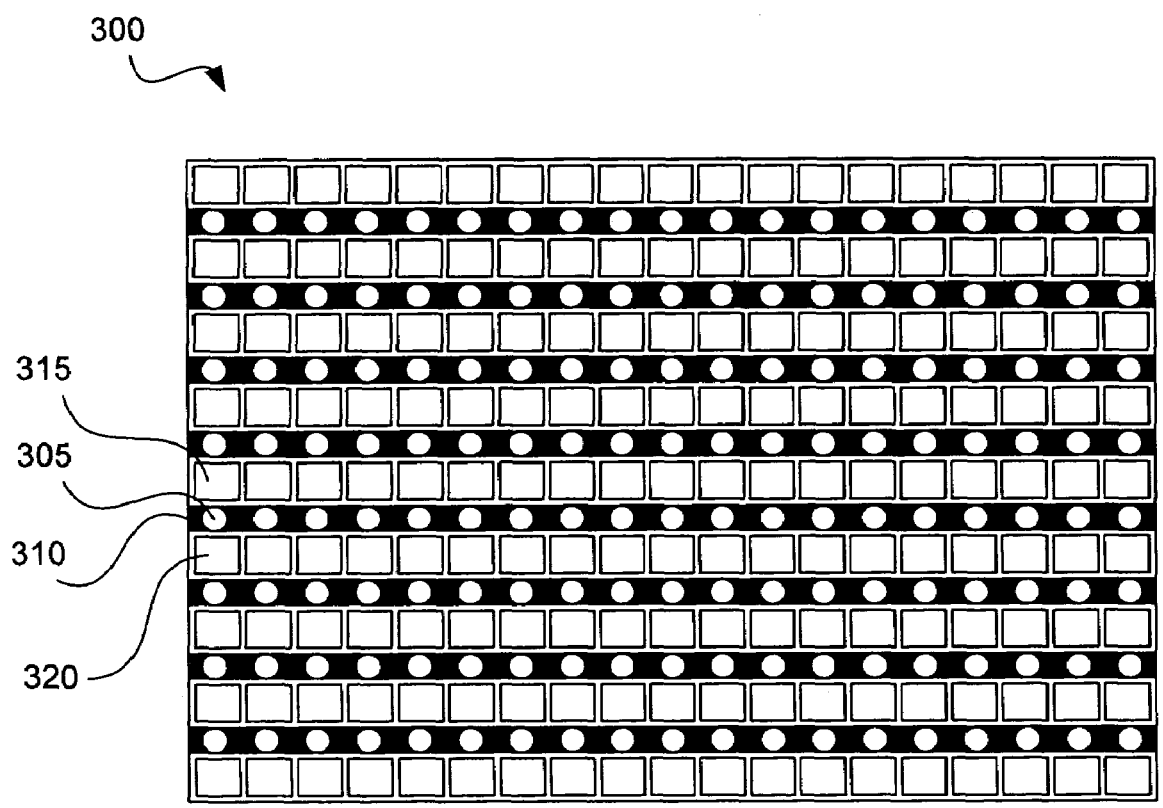
FIG. 3A depicts an exemplary "track" housing scheme of integrating image elements into a deep encased cell structure display according to one embodiment of the invention.

Integrating image capture devices into the displays can be done with varying degrees of intrusiveness, depending upon the type of display. FIG. 3A depicts an exemplary "track" housing scheme of integrating image elements 305 into a deep encased cell structure display 300 according to one embodiment of the invention. Each image element 305 is integrated into black strips 310, so that the spaces in-between each color cell 315 and 320 are used for both contrast enhancement and image capture.

Figure 3B:
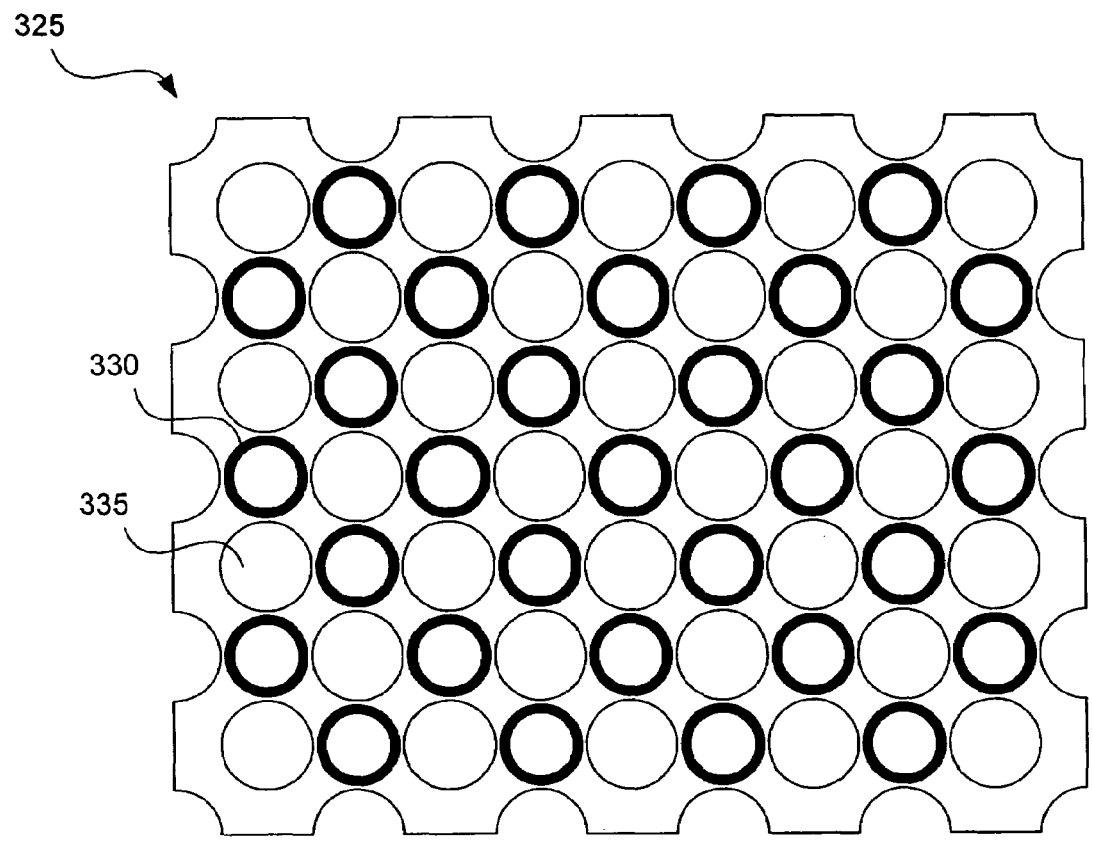
FIG. 3B depicts an exemplary shadow mask with integrated image elements according to one embodiment of the invention.

FIG. 3B depicts an exemplary shadow mask 325 with integrated image elements 330 according to one embodiment of the invention. Each image element 330 is placed in a previously-unused portion of a shadow mask 325, in-between each pixel opening 335.

Figure 3C:
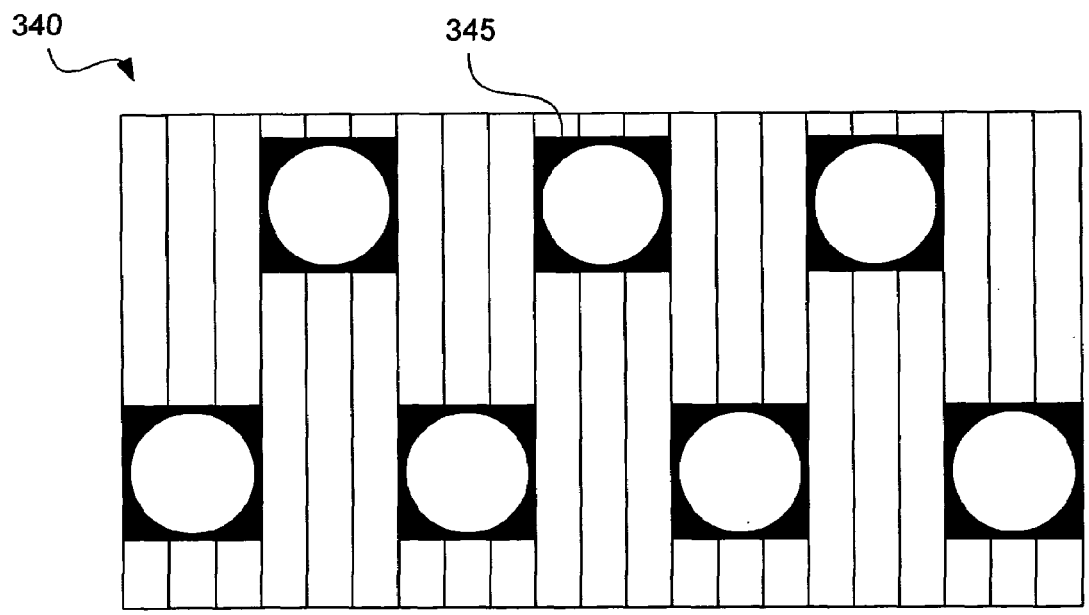
FIG. 3C depicts an exemplary aperture grill that has image elements dispersed over a display according to one embodiment of the invention.

FIG. 3C depicts an exemplary aperture grill 240 that has image elements 345 dispersed over the display according to one embodiment of the invention. In such a system, it may be expedient to block out whole pixels for each image element 345. Otherwise, a partially blocked pixel would optimally have the intensity of its color elements adjusted in order to reflect the obstructed portion of each pixel.

Figure 4:
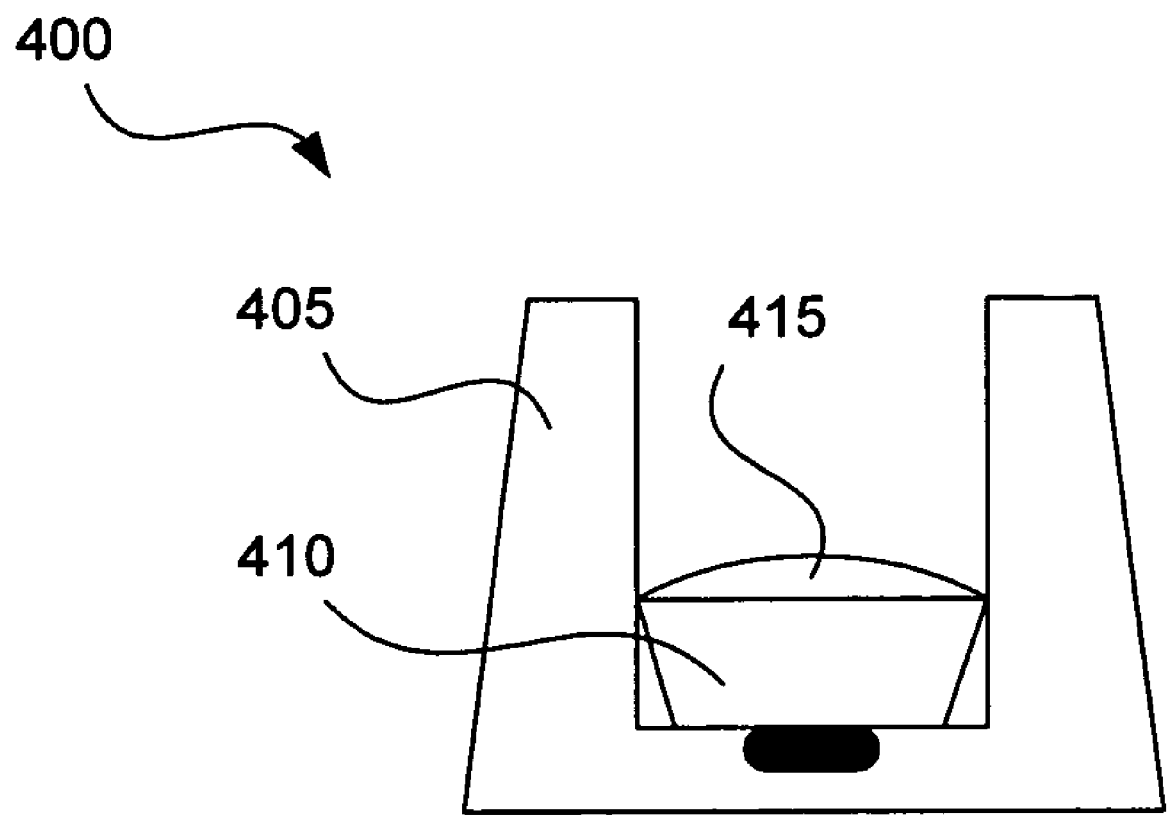
FIG. 4 depicts a cut-away elevation view of an exemplary image element according to one embodiment of the invention.

FIG. 4 depicts a cut-away elevation view of an exemplary image element 400 according to one embodiment of the invention. A housing 405 serves to block the light from the display from interfering with an image sensor 410. In schemes where the image elements are dispersed throughout the display (e.g., FIGS. 3B and 3C), the housing would completely surround each image sensor 410 (except for the input or sensing direction). However, in the track housing scheme of FIG. 3A, an entire track of image elements could be placed in a single well or channel, which may remove the necessity for a housing 405 around each individual image element. A lens 415 can be placed over each individual image sensor 410. Distortion would otherwise occur from placing a lens over the entire display, making some pixels more prominent than other pixels. The lens 415 could either be fixed or variable, depending upon application and implementation. For example, if the distance from the lens to the subject were known, then the improved display could simply act as a fixed-focus, fixed-zoom camera with a fixed focal length lens. Alternatively, if only a limited number of distances were possible, then different image elements might have fixed focal length lenses of different values. For example, in FIG. 3A, every other image element might have a first fixed focal length, while the remaining image elements all have a second fixed focal length.

In yet another embodiment, the lens might have a variable focal length in order to zoom and focus the image. The lens might either be physically moved or have its properties altered. In the latter case, the lens might be made of a material that changes its refractive index in response to electrical stimulus or a magnetic field. As those skilled in the art will appreciate, a lens can be made of any material that can be shaped to have a surface the allows light to have an appropriate angle of incidence and has an appropriate refractive index.

Figure 5:
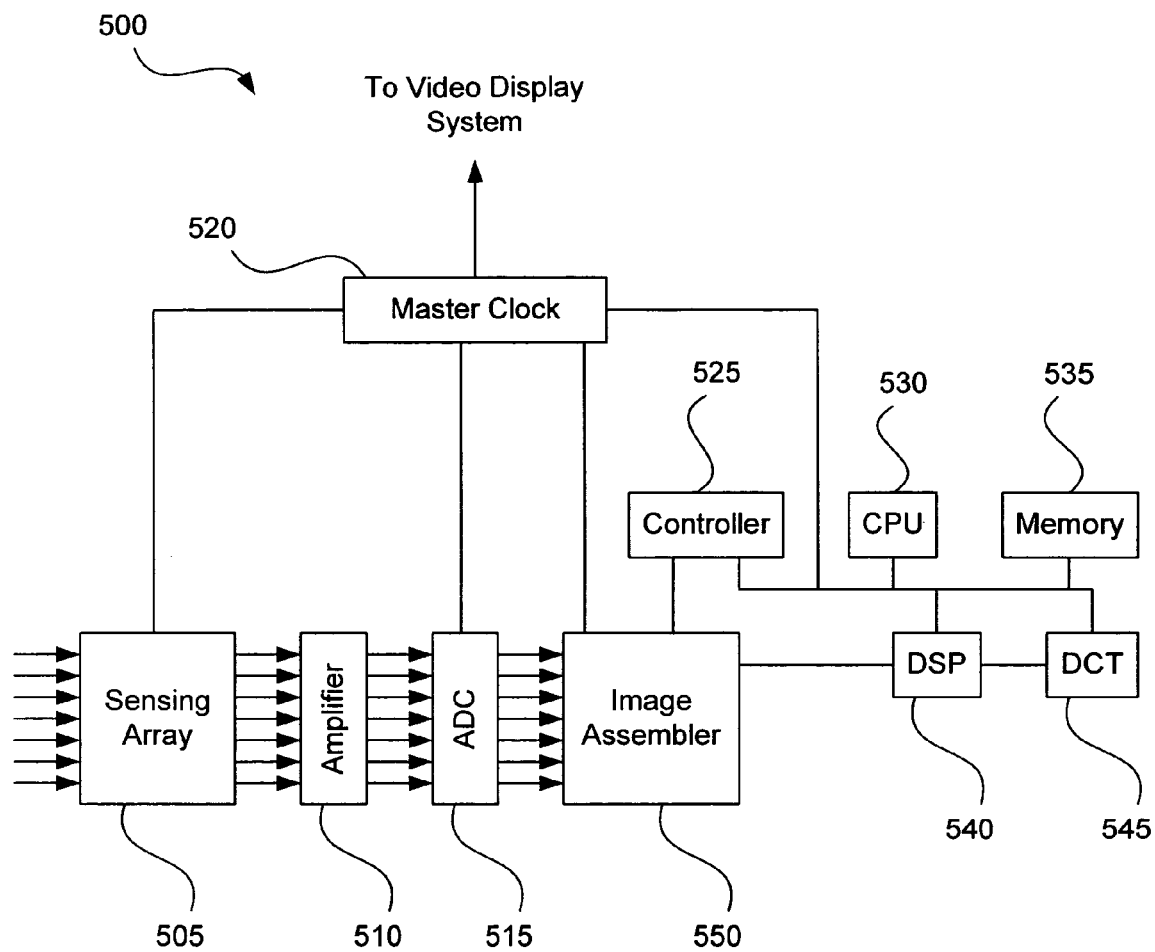
FIG. 5 is a schematic diagram of an exemplary system that could use the present invention.

FIG. 5 is a schematic diagram of an exemplary system 500 that could use the present invention. The system 500 includes an array of image elements 505 (sensing array), an amplifier 510, and analog-to-digital converter 515, a clock 520, a controller 525, a processor 530 (e.g., CPU), a memory 535, a digital signal processor (DSP) 540, and a discrete cosine transform (DCT) unit 545. Each component is an abstraction, and certain components may be combined or excluded as is well known in the art.

An image assembler 550 is an optional component that can be included and modified for various applications. If, for example two different fixed-focal length lenses were used, the image assembler 550 would only use the data from the image elements having the appropriate focal length.

Additionally, since most embodiments have each image element a relatively large distance away from every other image element, it may be desirable to use some mechanism to compensate for any distortion that might occur. Such issues are known in the art, and the image assembler 550 could be used to either interpolate extra pixels or delete out redundancies.

The invention is suitable for use for capturing images. The images can pertain to still pictures or videos. For example, the invention can be embodied as a digital camera in which a user can take a self-portrait by looking directly at a display which also provides image capture. The captured image is then what the user sees on the display.

Although illustrative embodiments and applications of this invention are shown and described herein, many variations and modifications are possible which remain within the concept, scope, and spirit of the invention, and these variations would become clear to those of ordinary skill in the art after perusal of this application. Accordingly, the present embodiments are to be considered as illustrative and not restrictive, and the invention is not to be limited to the details given herein, but may be modified within the scope and equivalents of the appended claims.

What is claimed is:

1. A device comprising:
   a display panel;
   an array of display elements located within the display panel, each display element capable of displaying a pixel of information, either alone or in combination with other display elements; and
   an array of image elements located within the display panel, each image element being capable of capturing visual information from a source in front of the display panel simultaneously with each display element displaying the pixel of information, each image element corresponding to a single pixel, each image element being shielded from light coming from the array of display elements, wherein the array of image elements is a two-dimensional array distributed among the array of display elements,
   wherein each image element has an individual sensor and an individual lens that is specific to the individual sensor, the individual lens for each individual sensor being placed over the individual sensor, and wherein each individual lens does not interfere with any display elements.

2. The device of claim 1, wherein the image elements are located in a housing that isolates the image elements from the display elements and blocks the light coming from the array of display elements.

3. The device of claim 2, wherein each image element is in its own housing.

4. The device of claim 3, wherein a row of image elements share a housing.

5. The device of claim 4, wherein the array of display elements is formed in a deep encased cell structure.

6. The device of claim 1, wherein the array of display elements is formed in a deep encased cell structure.

7. The device of claim 1, wherein the array of image elements is formed in a plurality of deep wells or channels.

8. The device of claim 1 further comprising an image assembler that modifies the data that is received by the array of image elements, the image assembler being arranged to compensate for distortion associated with the array of image elements.

9. The device of claim 1, wherein the image elements are dispersed within the display panel such that they do not block any display elements.

10. The device of claim 1, wherein the image elements are dispersed within the display panel in such a way that they prevent some pixels of information from being displayed.

11. The device of claim 1, wherein the device is used in a portable communication device.

12. The device of claim 11, wherein the portable communication device is a telephone.

13. The device of claim 11, wherein the portable communication device is personal digital assistant.

14. The device of claim 1, wherein the device is used in a computer monitor or a television.

15. The device of claim 1 wherein the display panel is a liquid crystal display (LCD) panel.

16. The device of claim 1 wherein the array of image elements includes a first image element and a second image element, the first image element having a first associated fixed focal length, the second image element having a second associated fixed focal length.

17. A device comprising:
    a display panel;
    an array of display elements located within the display panel, each display element capable of displaying a pixel of information, either alone or in combination with other display elements;
    an array of image elements located within the display panel, each image element being capable of capturing visual information from a source in front of the display panel, wherein the array of image elements is dispersed amongst the array of display elements and light coming from the array of display elements is blocked from each image element, wherein the display panel is an embedded macro charge-coupled device (CCD); and
    an image assembler, the image assembler being arranged to compensate for distortion associated with the array of image elements.

18. The device of claim 17, wherein the image elements are located in a housing that isolates the image elements from the display elements and blocks the light from the image elements.

19. The device of claim 18, wherein each image element is in its own housing.

20. The device of claim 18, wherein a row of image elements share a housing.

21. The device of claim 17 wherein each image element corresponds to a single pixel.

22. A device comprising:
    a display panel;
    an array of display elements located within the display panel, each display element of the array of display elements capable of displaying a pixel of information either individually or in combination with other display elements of the array of display elements; and
    an array of image elements located within the display panel, the array of image elements being a two-dimensional array distributed among the array of display elements, the array of image elements including at least a first image element and a second image element, the first image element and the second image element each being capable of capturing visual information from a source in front of the display panel simultaneously with each display element of the array of display elements displaying the pixel of information, the first image element corresponding to a first pixel and being shielded from light coming from the array of display elements, the second image element corresponding to a second pixel and being shielded from light coming from the array of display elements,
    wherein the first image element has a first sensor and a first lens that is specific to the first sensor, wherein the second image element has a second sensor and a second lens that is specific to the second sensor, the first lens and the second lens being arranged not to interfere with the array of display elements.

* * * * *